(12) United States Patent
Zhao

(10) Patent No.: US 10,720,588 B2
(45) Date of Patent: Jul. 21, 2020

(54) SUBSTRATE AND METHOD OF MANUFACTURING THE SAME, DISPLAY PANEL AND DISPLAY DEVICE

(71) Applicant: BOE TECHNOLOGY GROUP CO., LTD., Beijing (CN)

(72) Inventor: Dejiang Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/420,129

(22) Filed: May 22, 2019

(65) Prior Publication Data

US 2020/0044169 A1 Feb. 6, 2020

(30) Foreign Application Priority Data

Aug. 1, 2018 (CN) .......................... 2018 1 0862743

(51) Int. Cl.
*H01L 51/00* (2006.01)
*H01L 27/32* (2006.01)

(52) U.S. Cl.
CPC ...... *H01L 51/0096* (2013.01); *H01L 27/3246* (2013.01); *H01L 51/0005* (2013.01)

(58) Field of Classification Search
CPC combination set(s) only.
See application file for complete search history.

(56) References Cited

U.S. PATENT DOCUMENTS

| | | | |
|---|---|---|---|
| 9,842,890 B2 * | 12/2017 | Jang | .................... H01L 27/3244 |
| 2018/0031910 A1 | 2/2018 | Li et al. | |
| 2019/0096970 A1 | 3/2019 | Hou | |

FOREIGN PATENT DOCUMENTS

| | | |
|---|---|---|
| CN | 106783939 A | 5/2017 |
| CN | 107204359 A | 9/2017 |
| CN | 107591432 A | 1/2018 |

OTHER PUBLICATIONS

Office Action issued in corresponding Chinese Patent Application No. 201810862743.8, dated Mar. 27, 2020.

* cited by examiner

*Primary Examiner* — Matthew L Reames
(74) *Attorney, Agent, or Firm* — McDermott Will & Emery LLP

(57) ABSTRACT

A substrate and a method of manufacturing the same, a display panel, and a display device are provided, the substrate includes: a base substrate; a defining layer on the base substrate, the defining layer enclosing at least one printing region, the defining layer including: a first sub-defining layer on the base substrate; and a second sub-defining layer on a side of the first sub-defining layer away from the base substrate; and at least one pillar on the side of the first sub-defining layer away from the base substrate and in the at least one printing region, the at least one pillar is configured to break surface tension of ink formed in the at least one printing region.

20 Claims, 3 Drawing Sheets

SUBSTRATE AND METHOD OF MANUFACTURING THE SAME, DISPLAY PANEL AND DISPLAY DEVICE

CROSS-REFERENCE TO RELATED APPLICATION

This application claims the benefit of Chinese Patent Application No. 201810862743.8 filed on Aug. 1, 2018 in the State Intellectual Property Office of China, the whole disclosure of which is incorporated herein by reference.

TECHNICAL FIELD

The present disclosure relates to the field of display technology, and in particular, to a substrate and a method of manufacturing the same, a display panel, and a display device.

BACKGROUND

An electroluminescent display, such as an organic light-emitting diode (OLED) display, has the advantages of light weight, wide viewing angle, bright color, fast picture response, low energy consumption and flexible processing. It is considered to be one of the most attractive emerging technologies. In principle, positive carriers and negative carriers are injected into an organic semiconductor layer (i.e., light-emitting layer) and combined together so that the organic light-emitting diode (OLED) display emits light

SUMMARY

Some embodiments of the present disclosure provide a substrate comprising: a base substrate; a defining layer on the base substrate, the defining layer enclosing at least one printing region, the defining layer comprising: a first sub-defining layer on the base substrate; and a second sub-defining layer on a side of the first sub-defining layer away from the base substrate; and at least one pillar on the side of the first sub-defining layer away from the base substrate and in the at least one printing region, wherein the at least one pillar is configured to break surface tension of ink formed in the at least one printing region.

In some embodiments, a height of the at least one pillar is less than a height of the second sub-defining layer.

In some embodiments, the height of the at least one pillar is ⅕ to ½ of the height of the second sub-defining layer.

In some embodiments, the at least one pillar comprises a plurality of pillars spaced apart from each other along an inner sidewall, surrounding the at least one printing region, of the second sub-defining layer.

In some embodiments, wherein a distance between any two adjacent pillars is substantially from 5 μm to 15 μm.

In some embodiments, the second sub-defining layer surrounds the at least one pillar, and a gap exists between the at least one pillar and the second sub-defining layer.

In some embodiments, the gap is substantially from 2 μm to 10 μm.

In some embodiments, material of the first sub-defining layer comprises a lyophilic material, material of the second sub-defining layer comprises a lyophobic material, and material of the at least one pillar comprises a lyophilic material or a lyophobic material.

In some embodiments, the material of the first sub-defining layer has a first ink contact angle equal to or less than 30 degrees, the material of the second sub-defining layer has a second ink contact angle equal to or greater than 60 degrees, the material of the at least one pillar has a third ink contact angle equal to or greater than 60 degrees.

In some embodiments, at least one of the material of the first sub-defining layer, the material of the second sub-defining layer, or the material of the at least one pillar has viscosity of 5 cps to 10 cps.

In some embodiments, the material of the first sub-defining layer is one selected from a lyophilic organic material, SiN or $SiO_2$; the material of the second sub-defining layer comprises a lyophobic organic material; the material of the at least one pillar is one selected from a lyophilic organic material, a lyophobic organic material, SiN or $SiO_2$.

In some embodiments, the material of the at least one pillar is the same material as that of the first sub-defining layer or that of the second sub-defining layer.

In some embodiments, an orthographic projection of the second sub-defining layer on the base substrate and an orthographic projection of the at least one pillar on the base substrate both fall within an orthographic projection of the first sub-defining layer on the base substrate.

In some embodiments, the at least one pillar has a trapezoidal or rectangular cross section in a direction perpendicular to the base substrate.

In some embodiments, the ink comprises material of one selected from a group of materials for forming a light-emitting layer, a color film layer, a hole injection layer, a hole transport layer, an electron injection layer, and an electron transport layer.

Some embodiments of the present disclosure provide a display panel comprising the substrate of the above embodiments.

Some embodiments of the present disclosure provide a display device comprising the display panel of the above embodiments.

Some embodiments of the present disclosure provide a method of manufacturing a substrate comprising: forming a first sub-defining layer on a base substrate; forming a second sub-defining layer and at least one pillar on a side of the first sub-defining layer away from the base substrate, so as to form a defining layer comprising the first sub-defining layer and the second sub-defining layer, the defining layer enclosing at least one printing region, the at least one pillar being located in the at least one printing region; and forming ink in the at least one printing region, wherein the at least one pillar is configured to break surface tension of the ink.

In some embodiments, the at least one pillar is made of the same material and formed through the same patterning process as the first sub-defining layer or the second sub-defining layer.

In some embodiments, the method further comprising: drying the ink to form a film layer.

BRIEF DESCRIPTION OF THE DRAWINGS

The above and/or additional aspects and advantages of the present disclosure will become apparent and readily understood in the description of the embodiments in conjunction with the following drawings.

DETAILED DESCRIPTION OF THE EMBODIMENTS

Figure 1:
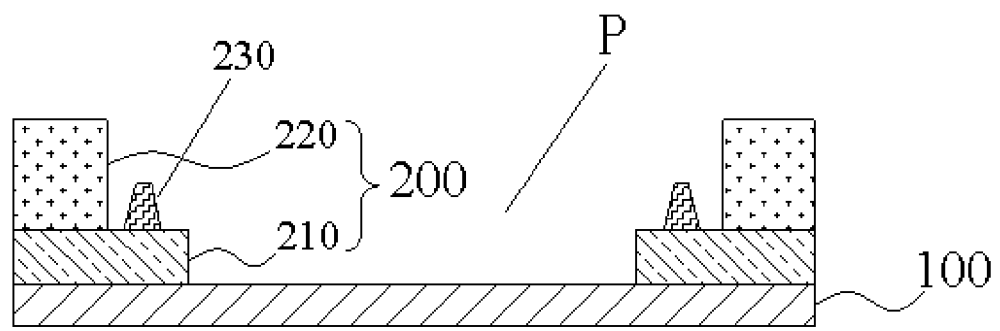
FIG. 1 shows a schematic cross-sectional view of an OLED substrate according to some embodiments of the present disclosure, where only one pixel printing region is shown.

The embodiments of the present disclosure are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative only, they are only for explaining the present disclosure, and are not to be construed as limiting the present disclosure.

In the OLED display technology, the manufacture of the light-emitting layer in the OLED is a hot spot of current research. Inkjet printing, as an important solution processing technology, not only improves the utilization of a light-emitting material (less material waste compared to evaporation), but also allows patterning without the use of a mask. At the same time, it has advantages of simple process, low cost, suitable for flexible substrates, etc. It is the most potential technology for manufacturing OLED displays.

The inventor has found that, in the related art, when the light-emitting layer of the OLED display is formed by inkjet printing, there are problems such as poor film formation uniformity of the light-emitting layer and poor display and so on. Through in-depth researches and a large number of experiments, the inventor has found that a "coffee ring" phenomenon typically occurs during drying the ink (including the light-emitting material) in the inkjet printing technology, thereby causing uneven deposition of the light-emitting material. As a result, a thickness of the formed light-emitting layer is not uniform. More specifically, due to the effect of the coffee ring effect, inkjet printing ink may be inclined to climb in each pixel, that is, the ink may climb up sidewalls of the pixel, so that an edge of the ink is thickened and a middle portion of the ink is thinned during it is dried. As a result, the thickness of the light-emitting layer formed after the ink is dried is not uniform, that is, the uniformity of a film layer is poor, thereby affecting the display effect of the OLED display device adversely. Therefore, it is important to form a high-quality light-emitting layer in process of manufacturing the OLED display. If the advantages of inkjet printing technology can be utilized to the greatest extent and the climbing phenomenon of inkjet printing ink is avoided, the light-emitting layer may have good film uniformity. In this way, the display effect of the OLED display may be greatly improved, and the market competitiveness of the product may be significantly improved.

Some embodiments of the present disclosure provide a substrate, the substrate includes a base substrate and a defining layer disposed on the base substrate. The defining layer encloses at least one printing region, and includes a first sub-defining layer disposed on the base substrate and a second sub-defining layer disposed on the first sub-defining layer. The substrate further includes at least one pillar disposed on a side of the first sub-defining layer away from the base substrate and located in the at least one printing region. The at least one pillar is configured to break surface tension of the ink formed in the printing region. By adopting the above substrate structure, the phenomenon of ink climbing and the "coffee ring" phenomenon can be effectively avoided during the inkjet printing process, so that the thickness of the formed film layer is uniform, the formed film layer has good film uniformity and high film quality.

The substrate in the embodiments of the present disclosure may include a substrate on which a film layer is formed by using the inkjet printing technology, such as an OLED substrate, a color filter substrate, or the like. The film layer formed by the inkjet printing technology may be, for example, a light-emitting layer, an electron injecting layer, an electron transporting layer, a hole injecting layer, a hole transporting layer of an OLED, a color film layer, or the like.

Embodiments will be described below by taking the OLED substrate and the light-emitting layer as an example.

Some embodiments of the present disclosure provide an OLED substrate. FIG. 1 shows a schematic cross-sectional view of an OLED substrate according to some embodiments of the present disclosure. Referring to FIG. 1, an OLED substrate includes a base substrate 100 and a defining layer disposed on the base substrate 100, such as a pixel defining layer 200 in the embodiments. According to the embodiments of the present disclosure, the pixel defining layer 200 encloses a plurality of printing regions on the base substrate 100, such as pixel printing regions P. The printing regions P are arranged in an array. It should be noted that only one pixel printing region is shown in FIG. 1.

According to the embodiments of the present disclosure, as shown in FIG. 1, the pixel defining layer 200 includes a first sub-defining layer 210 and a second sub-defining layer 220. The first sub-defining layer 210 is disposed on the base substrate 100, and the second sub-defining layer 220 is disposed on a surface of the first sub-defining layer 210 away from the base substrate 100. The OLED substrate further includes at least one pillar 230, for example, a plurality of pillars 230. The pillars 230 are disposed on the surface of the first sub-defining layer 210 away from the base substrate 100 and located in the pixel printing region P. According to the embodiments of the present disclosure, as shown in FIG. 1, the plurality of pillars 230 are located on a side of the second sub-defining layer 220 facing the pixel printing region P. In some embodiments, a height of each of the pillars 230 is substantially less than a height of the second sub-defining layer 220. With such a structure, the climbing phenomenon of the ink may be effectively avoided when a film layer is formed in the pixel printing region of the OLED substrate by inkjet printing, so that the formed light-emitting layer may have good uniformity of thickness and high film quality, and the display effect of the OLED display device including the OLED substrate may be significantly improved.

For the sake of easy understanding, the principle of realizing the above technical effects of the OLED substrate will be described in detail below.

Figure 2A:
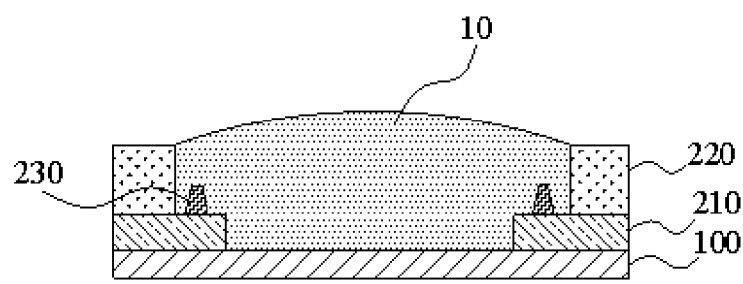
FIGS. 2(a)-2(c) show schematic cross-sectional views of an OLED substrate during a process of drying ink formed in a pixel printing region according to some embodiments of the present disclosure.
Figure 2B:
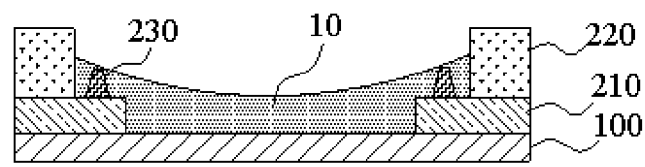
Figure 2C:
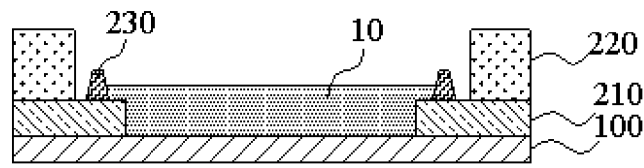

FIGS. 2(a)-2(c) show schematic cross-sectional views of an OLED substrate during drying ink formed in a pixel printing region according to some embodiments of the present disclosure.

In the process of forming the light-emitting layer of the OLED substrate by using the inkjet printing, first, referring to FIG. 2(a), the ink 10 (containing the light-emitting material forming the light-emitting layer) is printed in the pixel printing region P which is defined by the pixel defining layer (including the first sub-defining layer 210 and the second sub-defining layer 220). At this time, a large amount of the ink 10 is presented in the pixel printing region P. Due to the surface tension of the ink 10, the ink 10 is constrained within the corresponding pixel printing region P. In the case, even if a top surface of the ink 10 is higher than a top surface of the second sub-defining layer 220, the ink 10 in any two adjacent pixel printing regions P does not mix with each other.

Then, referring to FIG. 2(b), during drying the ink 10, a height of the ink 10 continuously decreases, and a top surface of the ink 10 gradually approaches a top surface of the pillar 230. At this time, the pillar 230 does not break the surface tension of the ink 10, and there is a problem of ink climbing caused by the coffee ring effect. As shown in FIG. 2(b), an ink climbing is generated at a position where the ink 10 is in contact with the second sub-defining layer 220. If the OLED substrate is not provided with the pillars, the ink climbing phenomenon will be kept, so that the thickness of the light-emitting layer formed by drying the ink is not uniform, and the uniformity of film layer is poor, thereby affecting the display effect adversely.

In some embodiments of the present disclosure, referring to FIG. 2(c), since the pillars 230 are arranged, when the ink 10 continues to climb during drying the ink, the pillars 230 may break the surface tension of the ink 10 to suppress ink climbing, thereby effectively avoiding the ink climbing phenomenon. As a result, the light-emitting layer formed by further drying the ink 10 has uniform thickness and high-quality film, thereby improving the display effect of the OLED display device including the OLED substrate.

In general, the OLED substrate including the pixel defining layer provided in the embodiments may effectively avoid the ink climbing phenomenon due to the arrangement of the pillars, and it is advantageous for manufacturing the light-emitting layer with good film thickness uniformity and high-quality film, thereby significantly improving the display effect of the OLED display device including the OLED substrate.

As previously described, the pixel defining layer 200 defines a plurality of pixel printing regions P arranged in an array on the base substrate 100. That is, as for each of the pixel printing regions P, the pixel defining layer 200 surrounds the pixel printing region P. The structure of the OLED substrate is described in detail below by taking one of the pixel printing regions P arrange in the array as an example:

According to some embodiments of the present disclosure, the specific material for forming the base substrate 100 is not particularly limited, and it may be selected by those skilled in the art according to actual conditions, as long as the material has a certain mechanical strength, and may provide sufficient support for other structures of the OLED substrate. For example, the base substrate 100 may be made of a glass material.

Figure 3:
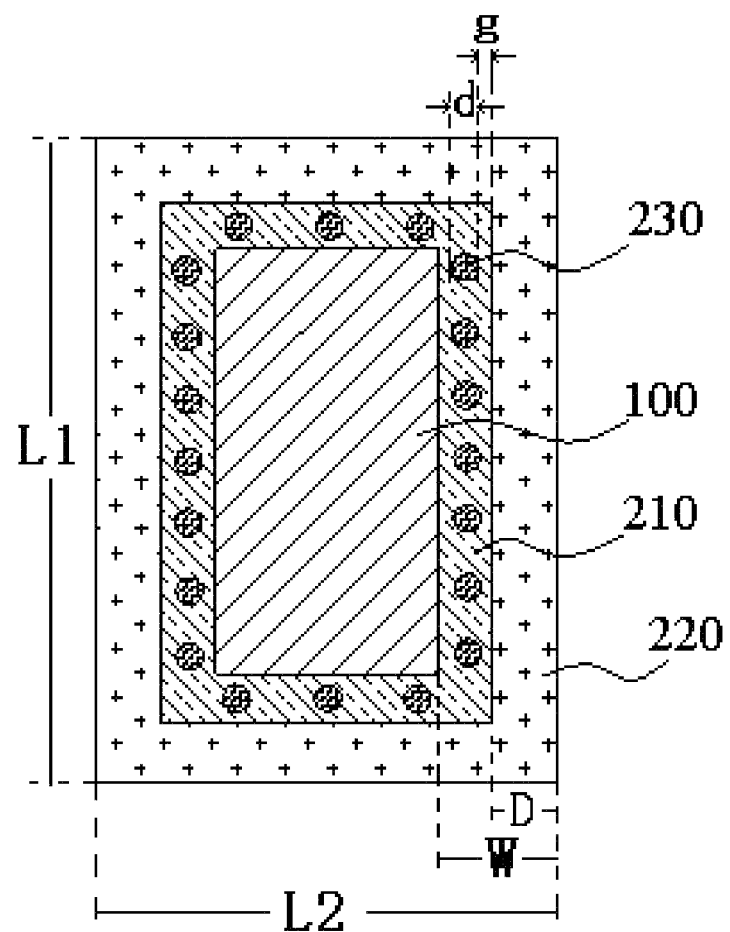
FIG. 3 shows a schematic plan view of an OLED substrate according to some embodiments of the present disclosure, where only one pixel printing region is shown.

According to some embodiments of the present disclosure, FIG. 3 shows a schematic plan view of an OLED substrate, wherein only one pixel printing region is shown. With reference to FIGS. 1 and 3, the first sub-defining layer 210 may be disposed on the base substrate 100 and surround the pixel printing region P, both an orthographic projection of the second sub-defining layer 220 on the base substrate 100 and orthographic projections of the pillars 230 on the base substrate 100 fall within an orthographic projection of the first sub-defining layer 210 on the base substrate 100.

According to some embodiments of the present disclosure, the first sub-defining layer 210 may be made of a lyophilic material whose surface is easily infiltrated by the ink 10. The viscosity of the material forming the first sub-defining layer 210 is not particularly limited, and it may be selected by those skilled in the art according to actual needs. For example, the material forming the first sub-defining layer 210 may be an organic material, and the viscosity of the organic material may be substantially from 5 to 10 cps. According to some embodiments of the present disclosure, an ink contact angle of the material forming the first sub-defining layer 210 may be 30 degrees or less. It is advantageous to form a light-emitting layer having a uniform film thickness in the pixel printing region P, thereby significantly improving the display effect of the OLED display device including the OLED substrate.

According to some embodiments of the present disclosure, the material forming the first sub-defining layer is not particularly limited, as long as the above-described requirements for the viscosity and the ink contact angle are satisfied. For example, according to some embodiments of the present disclosure, the material forming the first sub-defining layer 210 may include a hydrophilic organic material such as an organic material containing a hydroxyl group or a carboxyl group, or may be an inorganic material such as SiN or $SiO_2$ or the like. When the first sub-defining layer 210 is made of a hydrophilic organic material, the first sub-defining layer 210 may not only carry the second sub-defining layer 220 and the pillars 230 well, but also have good adhesion with the pillars 230, thereby facilitating to arranging the pillars 230 on the first sub-defining layer 210. According to the embodiments of the present disclosure, the height of the first sub-defining layer 210 is not particularly limited, and it may be selected by those skilled in the art according to actual needs. For example, according to some embodiments of the present disclosure, the height of the first sub-defining layer 210 may be in a range of 400 to 600 nm. Thereby, the performance of the OLED substrate may be further improved.

According to some embodiments of the present disclosure, referring to FIGS. 1 and 3, the second sub-defining layer 220 is disposed on the surface of the first sub-defining layer 210 away from the base substrate 100. The second sub-defining layer 220 may be disposed on the first sub-defining layer 210 and surround the pixel printing region P. According to some embodiments of the present disclosure, the second sub-defining layer 220 may be made of a lyophobic material whose surface is not easily infiltrated by the ink, thereby suppressing the ink climbing phenomenon. The material forming the second sub-defining layer 220 may be an organic material, and the viscosity of the organic material is not particularly limited, and it may be selected by those skilled in the art according to actual needs. For example, the material forming the second sub-defining layer 220 may have a viscosity of 5 to 10 cps. According to some embodiments of the present disclosure, the material forming the second sub-defining layer 220 has an ink contact angle of 60 degrees or more. According to some embodiments of the present disclosure, the second sub-defining layer 220 is made of the organic material. When a large amount of ink is present in the pixel printing region P, the lyophobic second sub-defining layer 220 may cause the ink to remain in the corresponding pixel printing region P, so that the ink in any two adjacent pixel printing regions P does not mix with each other.

According some embodiments of the present disclosure, the material forming the second sub-defining layer 220 is not particularly limited, and only the above-described requirements for the viscosity and the ink contact angle are satisfied. For example, according to some embodiments of the present disclosure, the material forming the second sub-defining layer 220 may include a lyophobic organic material, for example, an organic material including a benzene ring, a hydrocarbon group, a halogen atom, or the like. Thereby, the performance of the OLED substrate may be further improved. According to some embodiments of the present disclosure, the height of the second sub-defining layer 220 is not particularly limited, and it may be selected by those skilled in the art according to actual needs. For example, according to some embodiments of the present disclosure, the height of the second sub-defining layer may be in a range of 1.5 μm to 3 μm. Thus, the second sub-defining layer 220 may function as a retaining wall to isolate ink in each pixel printing region P, and to prevent the ink in any two adjacent pixel printing regions P mixing with each other.

According to some embodiments of the present disclosure, referring to FIGS. 1 and 3, the OLED substrate includes a plurality of pillars 230 for breaking the surface tension of the ink 10. According to some embodiments of the present disclosure, as shown in FIGS. 1 and 3, the plurality of pillars 230 are disposed along an inner sidewall of the second sub-defining layer surrounding the pixel printing region P, that is, the second sub-defining layer 220 surrounds the plurality of pillars 230. There is a gap between each of the pillars 230 and the second sub-defining layer 220, and the gap is substantially from 2 μm to 10 μm, optionally, for example, from 2 μm to 5 μm. The plurality of pillars 230 are spaced apart from each other, for example, evenly spaced. With this arrangement, the pillars may break the surface tension of the ink 10, and the ink climbing phenomenon may be suppressed. According to some embodiments of the present disclosure, the specific number of the pillars 230 is not particularly limited, as long as the pillars 230 may suppress the occurrence of the ink climbing phenomenon, so that the obtained light-emitting layer has a uniform film thickness. For example, in one pixel printing region P defined by the pixel defining layer 200, there are a plurality of pillars 230, for example, about twenty pillars 230, and the pillars are disposed on the first sub-defining layer 210, and circumferentially spaced apart along the edge of the pixel printing region P. In some embodiments, In an area of the first sub-defining layer 210 that is not covered by the second sub-defining layer 220, the ratio of an area of a portion where the pillars 230 are disposed to an area of a portion where the pillars 230 are not disposed may be from 1:3 to 1:2. According to some embodiments of the present disclosure, a distance between any adjacent two pillars 230 is not particularly limited, and it may be selected by those skilled in the art according to actual needs. For example, the distance between any adjacent two pillars is in a range of 5 μm to 15 μm. According to some embodiments of the present disclosure, the distance between any adjacent two pillars is substantially 10 μm. According to the embodiment of the present disclosure, the specific shape of the pillar 230 is not particularly limited, and it may be selected by those skilled in the art according to actual needs. For example, according to some embodiments of the present disclosure, the cross section of the pillar 230 in a direction perpendicular to the base substrate 100 may be trapezoidal or rectangular, for example, the pillar is a truncated cone or a cylinder. Thereby, it is possible to further avoid the ink climbing phenomenon of the ink during the inkjet printing process, and further improve the film thickness uniformity and the film quality of the light-emitting layer.

According to some embodiments of the present disclosure, the viscosity of the material forming the pillar 230 is not particularly limited, and it may be selected by those skilled in the art according to actual needs. For example, the material forming the pillar 230 may be an organic material, and the viscosity of the organic material may be from 5 cps to 10 cps. According to some embodiments of the present disclosure, the pillar 230 may be made of a lyophilic material, and the material forming the pillar 230 may have an ink contact angle of 30 degrees or less. In this case, the pillar functions to induce damage, that is, during drying the ink, the surface tension of the ink that is to climb is induced to damage, thereby suppressing the ink climbing. As a result, the ink climbing phenomenon is effectively avoided during the film formation process by inkjet printing, and the display effect of the OLED display device including the OLED substrate is remarkably improved. According to some embodiments of the present disclosure, the pillar 230 may be made of a lyophobic material, and the material forming the pillar 230 may have an ink contact angle of 60 degrees or more. In this case, the pillar 230 functions as an isolator, that is, in the drying process of the ink, the surface tension of the ink to be climbed is isolated and broken, thereby suppressing the ink climbing. As a result, the ink climbing phenomenon is effectively avoided during the film formation process by inkjet printing, and the display effect of the OLED display device including the OLED substrate is remarkably improved According to some embodiments of the present disclosure, the material forming the pillar 230 is not particularly limited, as long as the above-described requirements for the viscosity and the ink contact angle are satisfied. For example, according to some embodiments of the present disclosure, the material forming the pillar 230 may include a hydrophilic organic material such as an organic material including a hydroxyl group or a carboxyl group, or may be an inorganic material such as SiN or $SiO_2$ or the like. According to some embodiments of the present disclosure, the material forming the pillar 230 may include a lyophobic organic material such as an organic material containing a benzene ring, a hydrocarbon group, a halogen atom, or the like. According to the embodiments of the present disclosure, the height of the pillar 230 is not particularly limited, and it may be selected by those skilled in the art according to actual needs. For example, according to an embodiment of the present disclosure, the height of the pillar 230 is ⅕ to ½ of the height of the second sub-defining layer 220, for example, ¼ of the height of the second sub-defining layer 220. Thereby, the performance of the OLED substrate may be further improved.

In some embodiments of the present disclosure, the first sub-defining layer 210 and the second sub-defining layer 220 are generally made of different materials. Optionally, the material of the pillar 230 is different from that of either of first sub-defining layer 210 and the second sub-defining layer 220. In this case, the first sub-defining layer 210, the second sub-defining layer 220 and pillar 230 may be formed by different patterning processes. Optionally, the material of the pillar 230 is the same as that of the first sub-defining layer 210. In this case, the pillar 230 may be formed by the same patterning process as the first sub-defining layer 210. Optionally, the material of the pillar 230 is the same as that of the second sub-defining layer 220. In this case, the pillar 230 may be formed by the same patterning process as the second sub-defining layer 220.

According to some embodiments of the present disclosure, areas of orthographic projections of the first sub-defining layer 210, the second sub-defining layer 220, and the pillar 230 on the base substrate 100 are not particularly limited, and they may be selected by those skilled in the art according to actual needs. For example, those skilled in the art may design areas of orthographic projections of the first defining sub-layer 210, the second defining sub-layer 220, and the pillar 230 on the base substrate 100 according to the specific resolution of the pixel to obtain the required sizes of the first sub-defining layer 210, the second sub-defining layer 220, and the pillar 230. According to some embodiments of the present disclosure, when the pixel resolution is 160 ppi (Pixels Per Inch), taking one of the pixel printing regions P arranged in an array as an example, referring to FIG. 1 and FIG. 3, the first sub-defining layer 220 is disposed around the pixel printing region and has a shape of rectangle ring. For the orthographic projection of the first sub-defining layer 210 on the base substrate 100, a length L1 of a long side may be 180 μm, and a length L2 of a short side may be 60 μm, and a width W of each side may be 12 μm. The orthographic projection of the second sub-defining layer 220, which is disposed on the first sub-defining layer 210, on the base substrate 100 may also have a shape of rectangle ring, and a width D of each side of the second sub-defining layer 220 may be 4 μm. A diameter d of the pillar 230 may be 5 μm, a gap g between the pillar 230 and the second sub-defining layer 220 may be 3 μm. The distance between two adjacent pillars 230 may be 10 μm. When the dimensions of the respective structures (the first sub-defining layer 210, the second sub-defining layer 220, and the pillar 230) satisfy the above requirements, the effect of avoiding the ink climbing phenomenon as described above can be well achieved. In general, the OLED substrate can effectively avoid the ink climbing phenomenon during the firm formation process by inkjet printing, and can be used for manufacturing the light-emitting layer with good film thickness uniformity and high quality film formation, thereby significantly improving the display effect of the OLED display device including the OLED substrate.

Some embodiments of the present disclosure provide a method of manufacturing a substrate. The substrate is, for example, the substrate described in the previous embodiments, the substrate includes a base substrate and a defining layer disposed on the base substrate, the defining layer encloses at least one printing region, the defining layer includes a first sub-defining layer disposed on the base substrate and a second sub-defining layer disposed on the first sub-defining layer. The substrate further includes at least one pillar disposed on a side of the first sub-defining layer away from the base substrate and located in the at least one printing region. The at least one pillar is configured to break surface tension of the ink formed in the printing region. The substrate manufactured by the method can effectively avoid the ink climbing phenomenon during the firm formation process by inkjet printing, so that the thickness of the formed film layer is uniform, the formed film layer has good film uniformity and high film quality. The substrate manufactured by the above method may be an OLED substrate, the film layer is formed by inkjet printing may be a light-emitting layer, in this case, the display effect of an OLED display device including the OLED substrate can be significantly improved.

Figure 4:
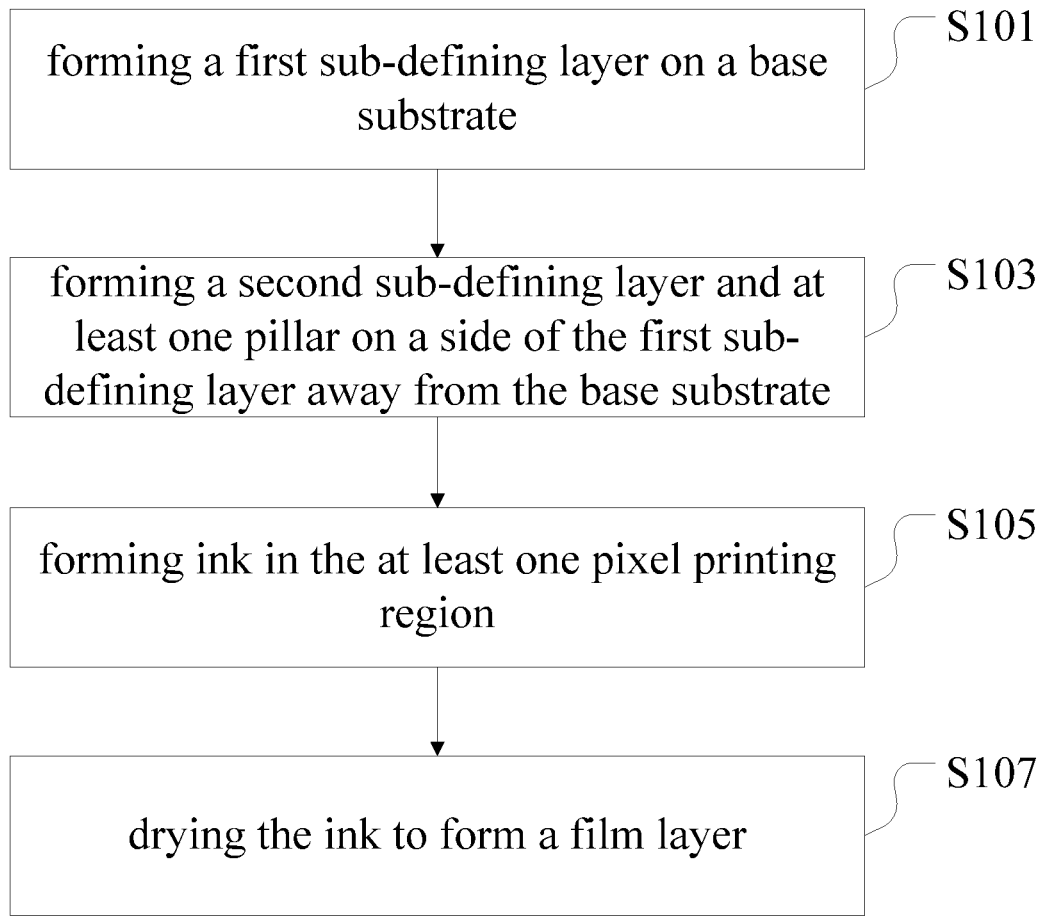
FIG. 4 shows a schematic flow chart of manufacturing an OLED substrate according to some embodiments of the present disclosure.

FIG. 4 shows a schematic flow chart of manufacturing an OLED substrate according to some embodiments of the present disclosure. Referring to FIG. 4, the method of manufacturing the OLED substrate includes:

S101: forming a first sub-defining layer on a base substrate;

S103: forming a second sub-defining layer and at least one pillar on a side of the first sub-defining layer away from the base substrate so as to form a defining layer comprising the first sub-defining layer and the second sub-defining layer, the defining layer enclosing at least one printing region, the at least one pillar being located in the at least one pixel printing region;

S105: forming ink in the at least one pixel printing region.

In the step S101, the specific material of the base substrate used in the method is not particularly limited, and it may be selected by those skilled in the art according to actual conditions, as long as the material has a certain mechanical strength, and may provide sufficient support for other structures of the OLED substrate. For example, the base substrate 100 is made of a glass material.

Referring to FIGS. 1 and 4, the first sub-defining layer 210 may be formed on the base substrate 100 by using a conventional patterning process. The conventional patterning process includes, for example, deposition, photoresist coating, exposure, development, etching, stripping or so on. A material forming the first sub-defining layer 210 is not particularly limited. According to some embodiments of the present disclosure, the material forming the first sub-defining layer 210 may include a hydrophilic organic material, such as an organic material including a hydroxyl group or a carboxyl group, or may be an inorganic material such as SiN or $SiO_2$ or the like.

In the step S103, referring to FIGS. 1 and 4, a second sub-defining layer 220 may be formed on the side of the first sub-defining layer 210 away from the base substrate 100 by a conventional patterning process, the conventional patterning process includes, for example, deposition, photoresist coating, exposure, development, etching, stripping or so on. A material forming the second sub-defining layer 220 is not particularly limited. According to some embodiments of the present disclosure, the material forming the second sub-defining layer 220 may include a lyophobic organic material, for example, an organic material including a benzene ring, a hydrocarbon group, a halogen atom, or the like.

In the step S103, referring to FIGS. 1 and 4, a plurality of pillars 230 may be formed on the side of the first sub-defining layer 210 away from the base substrate 100 by a conventional patterning process, the conventional patterning process includes, for example, deposition, photoresist coating, exposure, development, etching, stripping or so on. A material forming the pillar 230 is not particularly limited. According to some embodiments of the present disclosure, the material forming the pillar 230 may include a hydrophilic organic material, such as an organic material, containing a hydroxyl group or a carboxyl group, or may be an inorganic material such as SiN or $SiO_2$ or the like. According to some embodiments of the present disclosure, the material forming the pillar 230 may include a lyophobic organic material, for example, an organic material including a benzene ring, a hydrocarbon group, a halogen atom, or the like.

In some embodiments of the present disclosure, the first sub-defining layer 210 and the second sub-defining layer 220 are generally made of different materials. Optionally, the material of the pillar 230 is different from that of either of the first sub-defining layer 210 and the second sub-defining layer 220. In this case, the first sub-defining layer 210 and the second sub-defining layer 220 and pillar 230 can be formed by different patterning processes. Optionally, the material of the pillar 230 is the same as that of the first sub-defining layer 210. In this case, the pillar 230 may be formed by the same patterning process as the first sub-defining layer 210. Optionally, the material of the pillar 230 is the same as that of the second sub-defining layer 220. In this case, the pillar 230 may be formed by the same patterning process as the second sub-defining layer 220. In this way, the manufacturing process of the substrate may be simplified.

In the step S105, referring to FIGS. 2(a) and 4, ink is formed in the pixel printing region P by an inkjet printing process. The specific material of the ink is not particularly limited, and in some embodiments, the ink only needs to include a light-emitting material so that a desired light-emitting layer may be formed after drying the ink.

In some embodiments, the method of manufacturing the OLED substrate further includes:

S107: drying the ink to form a film layer, such as a light-emitting layer.

In step S107, referring to FIGS. 2(a)-(c), during the drying process of the ink 10, a height of the ink 10 continuously decreases, and a top surface of the ink 10 gradually approaches the top of the pillar 230. At this time, the pillar 230 does not break the surface tension of the ink 10, and there is a problem of ink climbing caused by the coffee ring effect. As shown in FIG. 2(b), an ink climbing is generated at a position where the ink 10 is in contact with the second sub-defining layer 220. Since the pillars 230 are arranged, when the ink 10 is to climb during the process of continuing to dry, the pillars 230 may break the surface tension of the ink 10 to suppress ink climbing, thereby effectively avoiding the ink climbing phenomenon. As a result, the light-emitting layer formed by further drying the ink 10 has uniform thickness and high quality film formation, thereby improving the display effect of the OLED display device including the OLED substrate.

In general, the OLED substrate manufactured by the method can effectively avoid the ink climbing phenomenon during the film formation process by inkjet printing, the light-emitting layer formed in the OLED substrate has good film thickness uniformity and high quality film formation, thereby significantly improving the display effect of the OLED display device including the OLED substrate.

Some embodiments of the present disclosure provide a display panel. The display panel includes the substrate described in the foregoing embodiments, thus, the display panel may have all of the features and advantages of the substrate described above. The display panel is, for example, an OLED display panel. In general, the display panel can effectively avoid the ink climbing phenomenon during the film formation process by inkjet printing, the light-emitting layer formed in the OLED substrate has good film thickness uniformity and high quality film formation, thereby significantly improving the display effect of the OLED display device including the OLED substrate.

Figure 5:
FIG. 5 shows a schematic structural view of a display device according to some embodiments of the present disclosure.

Some embodiments of the present disclosure provide a display device. According to some embodiments of the present disclosure, referring to FIG. 5, the display device 1000 includes the display panel described above, such as an OLED display device. Thus, the OLED display device 1000 may have all of the features and advantages of the previously described display panel. In general, the OLED display device can avoid the ink climbing phenomenon during the film formation process by inkjet printing, the light-emitting layer has good film thickness uniformity and high quality film formation, thereby significantly improving the display effect of the OLED display device.

The display device in the embodiments may be any product or component having a display function such as a display panel, an electronic paper, a mobile phone, a tablet computer, a television, a notebook computer, a digital photo frame, a navigator, or the like.

In the description of the present disclosure, the orientation or positional relationship of the terms "upper", "lower" and the like is based on the orientation or positional relationship shown in the drawings, and is merely for the convenience of describing the present disclosure and d is not intended to require that the present disclosure be constructed and operated in a particular orientation. Therefore, they are not construed as limiting the disclosure.

In the description of the present specification, the description of the terms "one embodiment", "another embodiment" or the like means that the specific features, structures, materials or characteristics described in connection with the embodiment are included in at least one embodiment of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. Further, various embodiments or examples described in the specification and features of various embodiments or examples may be combined without departing from the scope of the invention. In addition, it should be noted that in the present specification, the terms "first" and "second" are used for descriptive purposes only, and are not to be construed as indicating or implying a relative importance or implicitly indicating the number of technical features.

While the embodiments of the present disclosure have been shown and described above, it is understood that the foregoing embodiments are illustrative and are not to be construed as limiting the scope of the disclosure. Variations, modifications, substitutions and changes of the above-described embodiments may be made by those skilled in the art within the scope of the present disclosure.

What is claimed is:

1. A substrate comprising:
    a base substrate;
    a defining layer on the base substrate, the defining layer enclosing at least one printing region, the defining layer comprising:
        a first sub-defining layer on the base substrate; and
        a second sub-defining layer on a side of the first sub-defining layer away from the base substrate; and
    at least one pillar on the side of the first sub-defining layer away from the base substrate and in the at least one printing region,
    wherein the at least one pillar is configured to break surface tension of ink formed in the at least one printing region.

2. The substrate of claim 1, wherein a height of the at least one pillar is less than a height of the second sub-defining layer.

3. The substrate of claim 2, wherein the height of the at least one pillar is ⅕ to ½ of the height of the second sub-defining layer.

4. The substrate of claim 1, wherein the at least one pillar comprises a plurality of pillars spaced apart from each other along an inner sidewall, surrounding the at least one printing region, of the second sub-defining layer.

5. The substrate of claim 4, wherein a distance between any two adjacent pillars is substantially from 5 μm to 15 μm.

6. The substrate of claim 1, wherein the second sub-defining layer surrounds the at least one pillar, and a gap exists between the at least one pillar and the second sub-defining layer.

7. The substrate of claim 6, wherein the gap is substantially from 2 μm to 10 μm.

8. The substrate of claim 1, wherein material of the first sub-defining layer comprises a lyophilic material, material of the second sub-defining layer comprises a lyophobic material, and material of the at least one pillar comprises a lyophilic material or a lyophobic material.

9. The substrate of claim 8, wherein the material of the first sub-defining layer has a first ink contact angle equal to or less than 30 degrees, the material of the second sub-defining layer has a second ink contact angle equal to or greater than 60 degrees, the material of the at least one pillar has a third ink contact angle equal to or greater than 60 degrees.

10. The substrate of claim 8, wherein at least one of the material of the first sub-defining layer, the material of the second sub-defining layer, or the material of the at least one pillar has viscosity of 5 cps to 10 cps.

11. The substrate of claim 8, wherein the material of the first sub-defining layer is one selected from a lyophilic organic material, SiN or $SiO_2$; the material of the second sub-defining layer comprises a lyophobic organic material; the material of the at least one pillar is one selected from a lyophilic organic material, a lyophobic organic material, SiN or $SiO_2$.

12. The substrate of claim 8, wherein the material of the at least one pillar is the same material as that of the first sub-defining layer or that of the second sub-defining layer.

13. The substrate of claim 1, wherein an orthographic projection of the second sub-defining layer on the base substrate and an orthographic projection of the at least one pillar on the base substrate both fall within an orthographic projection of the first sub-defining layer on the base substrate.

14. The substrate of claim 1, wherein the at least one pillar has a trapezoidal or rectangular cross section in a direction perpendicular to the base substrate.

15. The substrate according to claim 1, wherein the ink comprises material of one selected from a group of materials for forming a light-emitting layer, a color film layer, a hole injection layer, a hole transport layer, an electron injection layer, and an electron transport layer.

16. A display panel comprising the substrate of claim 1.

17. A display device comprising the display panel of claim 16.

18. A method of manufacturing a substrate comprising:
forming a first sub-defining layer on a base substrate;
forming a second sub-defining layer and at least one pillar on a side of the first sub-defining layer away from the base substrate, so as to form a defining layer comprising the first sub-defining layer and the second sub-defining layer, the defining layer enclosing at least one printing region, the at least one pillar being located in the at least one printing region; and
forming ink in the at least one printing region,
wherein the at least one pillar is configured to break surface tension of the ink.

19. The method of claim 18, wherein the at least one pillar is made of the same material and formed through the same patterning process as the first sub-defining layer or the second sub-defining layer.

20. The method of claim 18, further comprising:
drying the ink to form a film layer.

* * * * *